United States Patent [19]
Yokosawa et al.

[11] Patent Number: 5,166,614
[45] Date of Patent: Nov. 24, 1992

[54] INTEGRATED-TYPE SQUID MAGNETOMETER HAVING A MAGNETIC SHIELD, AND A MULTICHANNEL SQUID MAGNETOMETER USING THE SAME

[75] Inventors: Koichi Yokosawa, Kokubunji; Hideaki Nakane, Hachioji, both of Japan

[73] Assignee: Hitachi, Ltd., Tokyo, Japan

[21] Appl. No.: 525,665

[22] Filed: May 21, 1990

[30] Foreign Application Priority Data

May 25, 1989 [JP] Japan ................. 1-132413

[51] Int. Cl.$^5$ ............................................ G01R 33/035
[52] U.S. Cl. .................................... 324/248; 505/846
[58] Field of Search ............. 324/248; 307/306; 336/84 R, 84 M, 84 C; 505/843, 845, 846, 702

[56] References Cited

U.S. PATENT DOCUMENTS

| | | | |
|---|---|---|---|
| 4,591,787 | 5/1986 | Hoenig | 324/248 |
| 4,694,567 | 9/1987 | Daalsmans | 324/248 X |
| 4,700,135 | 10/1987 | Hoenig | 324/248 |
| 4,749,946 | 6/1988 | Hoenig | 324/248 |
| 4,761,611 | 8/1988 | Hoenig | 324/248 |
| 4,801,882 | 1/1989 | Daalmans | 324/248 |

FOREIGN PATENT DOCUMENTS

| | | |
|---|---|---|
| 0111826 | 6/1984 | European Pat. Off. . |
| 0184670 | 6/1986 | European Pat. Off. . |
| 0327123 | 8/1989 | European Pat. Off. . |

OTHER PUBLICATIONS

Boudarenko et al., "A planar thin-film SQUID of high inductive coupling constant", *Cryogenics*, vol. 23, No. 5, May 1983, pp. 263-264.

Nakanishi et al., "2-Channel DC-SQUID Magnetometer System For Biomagnetic Application", *Biomagnetism '87*, 1988, pp. 446-449.

Ketchen et al., "Ultra-Low-Noise Tunnel Junction DC SQUID With A Tightly Coupled Planar Input Coil", *Appl. Phys. Letters*, 40(8), Apr. 15, 1982, pp. 736-738.

*Primary Examiner*—Gerard R. Strecker
*Assistant Examiner*—W. S. Edmonds
*Attorney, Agent, or Firm*—Antonelli, Terry, Stout & Kraus

[57] ABSTRACT

A pickup coil and a planar type SQUID are formed integrally on a single substrate to form a SQUID magnetometer. The SQUID is disposed on the surface of a projecting portion of the substrate and an insulating layer for spacing is laminated on the SQUID. The top, bottom and side surfaces of the assembly of the SQUID and insulating layer covering the same are all covered with a superconducting layer to form a magnetic shield for enclosing the SQUID. The magnetic shield is remote from the planar type pickup coil disposed on the remaining portion of the substrate by a distance which is equal to or greater than a length of one side of the size of the magnetic shield, thereby preventing magnetic flux distortion due to the presence of the magnetic shield from disturbing coil balance of the pickup coil.

19 Claims, 6 Drawing Sheets

INTEGRATED-TYPE SQUID MAGNETOMETER HAVING A MAGNETIC SHIELD, AND A MULTICHANNEL SQUID MAGNETOMETER USING THE SAME

BACKGROUND OF THE INVENTION

The present invention is relevant to a technical field of measurement of weak magnetic fields and more particularly it relates to a so-called SQUID magnetometer using a SQUID (superconducting quantum interference device) and a system for biomagnetic measurements using the SQUID magnetometer.

The SQUID constructed of a superconducting circuit including Josephson junctions is used for detection of weak magnetic fields. The SQUID is typically applied to a SQUID magnetometer using a DC-SQUID and the SQUID magnetometer has in general a construction as shown in FIG. 10. Referring to FIG. 10, a SQUID ring 7 is coupled magnetically with an input coil 8 and a modulation coil 9. Generally, the components 7, 8 and 9 are ganged to constitute a SQUID. The SQUID ring 7 is supplied with a DC bias current from an electronic circuit 15 and the modulation coil 9 is applied with a modulation signal and a feedback signal.

An input signal indicative of a magnetic flux passing through a pickup coil 60 is applied to the input coil 8.

These components of the input coil, modulation coil and SQUID ring may be formed on a single chip through the use of thin film technology and a resulting structure can be called a planar type SQUID. U.S. Pat. No. 4,761,611 discloses a SQUID gradiometer using a planar type SQUID. In this literature, a gradiometer coil of, for example, linear differential type is used as a pickup coil and connected by a superconducting cable to the SQUID contained in a magnetic shield case. Most typically, the SQUID magnetometer is constructed as in this literature, wherein the SQUID and the pickup coil are separately provided and the two are interconnected through the superconducting cable. On the other hand, there is disclosed in Biomagnetism '87 (1988), pp. 446–449 an example of an integrated-type SQUID magnetometer wherein a SQUID and a pickup coil are both formed on a single substrate through the use of thin film technology. This integrated-type SQUID magnetometer is not provided with any magnetic shield and is used, along with an object to be measured, in a magnetic shield room.

SUMMARY OF THE INVENTION

The aforementioned integrated-type SQUID magnetometer is advantageous over the pickup coil separated type magnetometer in that many integrated-type magnetometers can be aggregated densely to form a multi-channel magnetometer and that high stability against heat cycle can be ensured because of a smaller number of connections of foreign superconductor. However, it has been verified that the integrated type has difficulties in cancellation of noise magnetic field and prevention of generation of flux trap upon charging of cooling agent. More specifically, proximity of the SQUID to the pickup coil makes it difficult to provide the SQUID with magnetic shield and any magnetic shield provided for the SQUID would disturb balance of the pickup coil and block magnetic coupling between the input coil and the SQUID ring, raising a variety of like problems. A SQUID magnetometer without magnetic shield is exposed to earth magnetism and ambient noise and upon charging of cooling agent, flux trap due to these noise fields occurs to make the SQUID magnetometer inoperable at high probabilities. To prevent these disadvantages, the use of the magnetometer is restricted such that it can be used only in a magnetic shield room of high performance.

An object of the invention is to provide a SQUID magnetometer suitable for formation of a densely aggregated multi-channel magnetometer and imune from the influence of noise magnetic fields.

Another object of the invention is to provide an integrated-type SQUID magnetometer capable of providing magnetic shield which does not substantially disturb coil balance of the pickup coil.

Still another object of the invention is to provide an integrated-type SQUID magnetometer capable of providing magnetic shield which does not substantially block magnetic coupling between the input coil and SQUID ring of the SQUID.

Still another object of the invention is to provide a multi-channel SQUID magnetometer which is not liable to cause flux trap, especially, a system for biomagnetic measurements using the same.

Constructionally, the present invention is featured in that a pickup coil and a SQUID are integrally formed on the same substrate and a magnetic shield formed of a thin film superconductor is provided at the SQUID. More specifically, in terms of an area projected on the substrate, the magnetic shield has an area which is $N^2$ times that of the SQUID, where N has a value ranging from 1.1 to 5. The magnetic shield is so disposed as to be spaced from the pickup coil by a distance which is equal to or greater than one side length of the magnetic shield.

Another feature of the present invention resides in that a layer through which magnetic flux can pass is interposed between the SQUID and the magnetic shield, the layer having a thickness which is 10 to 10,000 times that of an insulating layer interposed between the SQUID ring and the input coil within the SQUID.

DESCRIPTION OF THE PREFERRED EMBODIMENTS

An embodiment of the invention as applicable to a multi-channel magnetoencephalograph will now be described with reference to the accompanying drawings.

Figure 1:
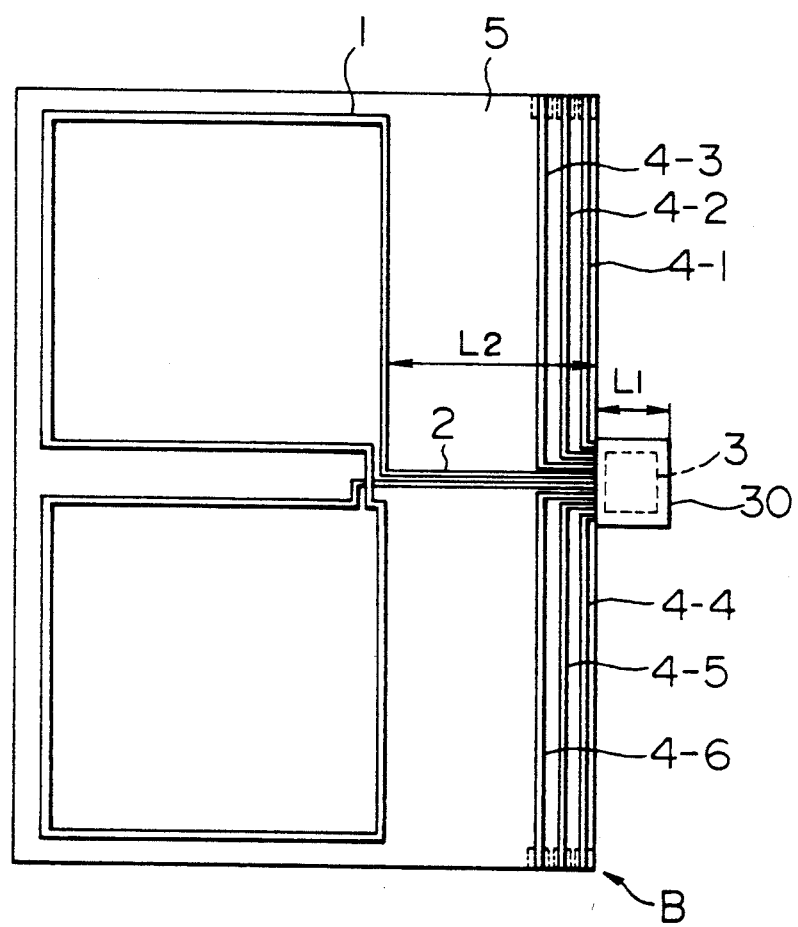
FIG. 1 is a plan view of a magnetometer according to an embodiment of the invention.

Referring to FIG. 1, there is illustrated, in plan view form, a SQUID magnetometer for use in a magnetoencephalograph. A flat, rectangular substrate 5 has a projecting portion which juts out of the middle of one side of the substrate. The projecting portion is provided with a SQUID 3 and the remainder of a rectangular large-area portion is provided with a pickup coil 1 to form an integrated-type SQUID magnetometer in which the pickup coil and the SQUID are formed integrally on the same substrate. For example, the size of the substrate 5 suitable for use in multi-channel magnetoencephalographs is such that the rectangular large-area portion is approximately 30 mm ×40 mm and the projecting portion is approximately 1 mm ×1 mm. The substrate 5 has a thickness of, for example, 0.5 mm.

The SQUID 3 is surrounded or enclosed by a superconducting film 30 as will be detailed later. The substrate 5 may be made, in principle, of any material through which magnetic flux can pass, but, in this embodiment, a single crystalline silicon plate is used which is advantageous from the standpoint of heat cycle proof and easiness of formation of the SQUID. The pickup coil 1 is a planar linear differential coil for detecting a differential component, vertical to the sheet of drawing, of a magnetic flux passing through the sheet of drawing and has a lead 2 connected to an input coil 8 of the SQUID. These coils and the lead are formed of superconductive metal films, preferably, niobium films. The lead and the coils have crossing portions which are insulated from each other by an insulating film, preferably, a silicon oxide film interposed therebetween. Similarly, a superconductive metal film and an insulating film are laminated on the projecting portion to form the planar type SQUID 3. Formed near one edge of the substrate 5 are leads for the SQUID including DC bias leads 4-1 and 4-4, signal take-out leads 4-2 and 4-5 and feedback modulation leads 4-3 and 4-6.

Figure 2:
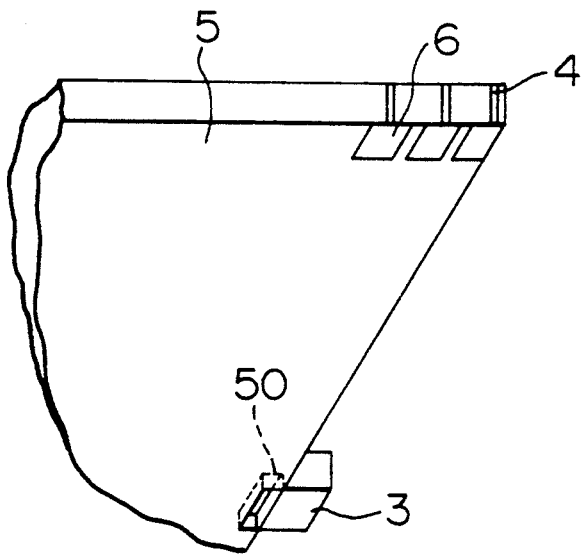
FIG. 2 is an enlarged fragmentary perspective view showing a portion of the FIG. 1 magnetometer.

FIG. 2 illustrates, in perspective view form, details of tip ends (portion B in FIG. 1) of the leads 4-1 to 4-6. A lead conductor 4 representative of each of the leads 4-1 to 4-6 runs on the top surface of the substrate 5, goes round an end edge of the substrate 5 and connects to a connection pad 6 formed on the bottom surface of the substrate 5.

Figure 3:
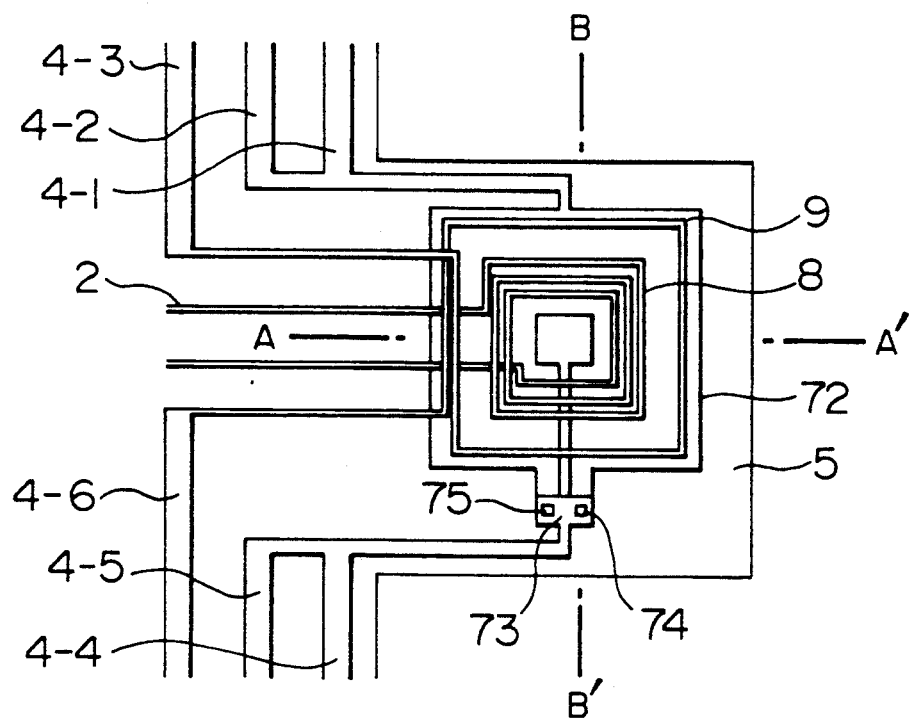
FIG. 3 is an enlarged fragmentary plan view showing a portion of the FIG. 1 magnetometer.
Figure 4:
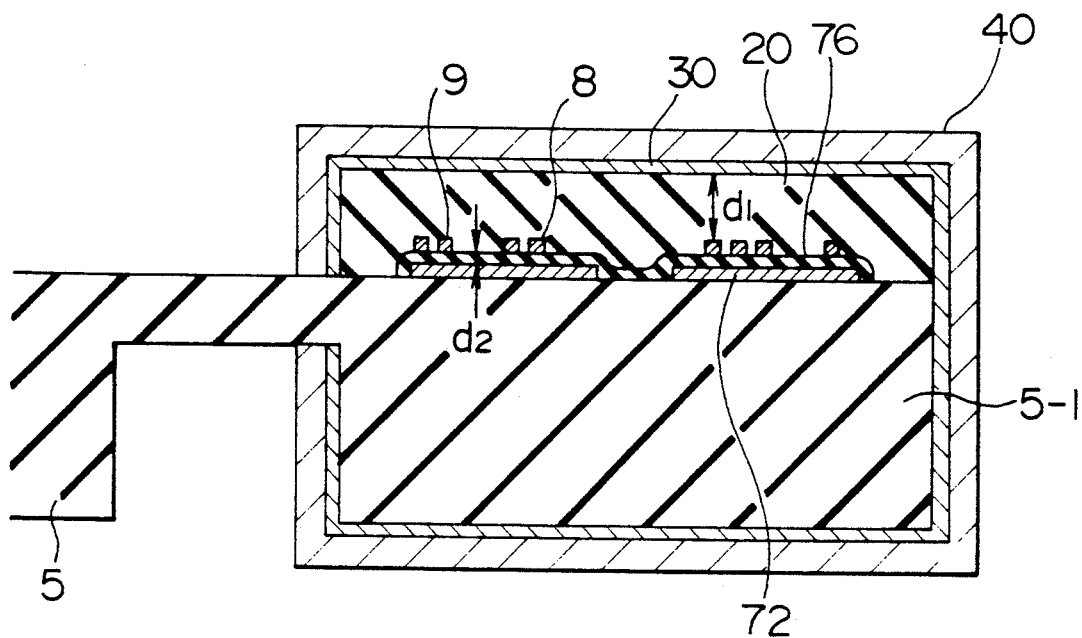
FIGS. 4 and 5 are enlarged fragmentary sectional views showing the portion of FIG. 3.
Figure 5:
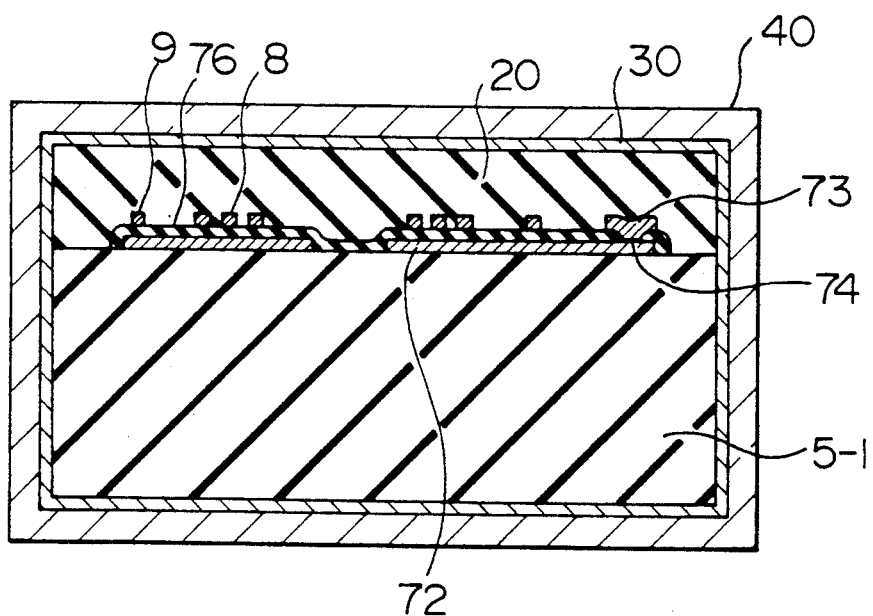

The substrate portion at which the SQUID 3 is formed is illustrated exaggeratedly in plan view in FIG. 3. FIG. 4 is a sectional view taken on the line A—A' of FIG. 3 and FIG. 5 is a sectional view taken on the line B—B'. In FIG. 3, the magnetic shield and the insulating layer are omitted to expose the SQUID per se. Provided on the surface of the projecting portion, designated at 5-1 in FIGS. 4 and 5, are a washer-like superconducting layer 72 having a slit and a superconducting layer 73 which bridges the slit, thus forming the SQUID ring. An insulating layer 76 is interposed between the layers 72 and 73, and Josephson junctions are formed as designated at 74 and 75. Of the leads described in connection with FIG. 1, the leads 4-1 and 4-2 are connected to the washer 72 and the leads 4-4 and 4-5 are connected to the superconducting layer 73. The insulating layer 76 covers the entire top surface of the washer 72, and the input coil 8 of multiple turns and the modulation coil 9 of one turn are formed on the insulating layer 76. The input coil 8 is connected to the pickup coil 1 through the lead 2 and the modulation coil 9 is connected to the leads 4-3 and 4-6. With the above construction, the input coil 8 and modulation coil 9 are magnetically coupled to the SQUID ring.

The projecting portion of the substrate thus provided with the SQUID is covered with an insulating layer 20 for spacing. The superconducting film 30 and a metal film 40 are deposited to cover all of the top surface, bottom surface and side surfaces of the projecting portion covered with the insulating layer, thus enclosing the projecting portion. The insulating layers 76 and 20 may be made of, in principle, any materials through which magnetic flux can pass but in this embodiment, silicon oxide is used. The superconducting film 30 serves as a magnetic shield for shielding the SQUID from earth magnetism and ambient noise, and in this embodiment it is realized with a niobium film of 500 nm thickness. The metal film 40 is adapted to rapidly transfer heat generated from the SQUID magnetometer immersed in cooling agent to the cooling agent and therefore it may be made of any thermally conductive materials but in this embodiment a gold film is used.

The superconducting thin film 30 is flattened and smoothed in order to prevent flux trap from occurring in the superconducting thin film 30 per se when cooling. Further, as shown in FIG. 2, the root of the projecting portion 5-1 of the substrate 5 is recessed to form a cutting 50 in the bottom surface of the substrate and as shown in FIG. 4, one side wall of the cutting 50 is also covered with part of the superconducting thin film 30 to reduce the magnetically opened area of the magnetic shield so that shielding effect may be promoted.

Since magnetic flux can not pass through the magnetic shield, the provision of magnetic shield may possibly distort ambient magnetic flux and disturb coil balance of the linear differential coil if the large-area magnetic shield is located near the pickup coil 1. Through experiments, it has been verified that flux distortion is practically negligible when the pickup coil is remote from the magnetic shield by a distance which is equal to or greater than the size of the magnetic shield. To describe with reference to FIG. 1, the distance, L2, between pickup coil 1 and magnetic shield 30 has to be equal to or greater than the length, L1, of one side of the magnetic shield 30. Preferably, L2 may be approximately 2 to 5 times L1.

The L2 being in excess of the above range adversely affects SQUID's densely aggregated to form a multi-channel SQUID magnetometer. Further, the smaller the area of the magnetic shield projected upon a plane coplanar to the substrate surface, the smaller the aforementioned flux distortion becomes so that the distance between pickup coil and SQUID can be reduced to thereby reduce the overall size of the SQUID magnetometer. However, in order to permit magnetic coupling between the SQUID ring and the input coil or modulation coil within the SQUID, a flux path must be established within the shield and this requirement leads to an increase in the projecting area. To meet the two contradictory conditions, the area of the magnetic shield projected upon the plane coplanar to the substrate surface is preferably set to be $N^2$ times that of the SQUID, where N has a value ranging from 1.1 to 5.

In addition, the degree of magnetic coupling between the SQUID ring and the input coil or modulation coil depends on the ratio between thicknesses d1 and d2 of the insulating layers 20 and 76 in such a manner that as the d1/d2 ratio value decreases, the magnetic coupling is impeded. The practically permissible d1/d2 ranges from 10 to 10,000. The d1 going beyond the above range is not so effective as to be expected for the sake of improving magnetic coupling but conversely aggravates distortion of flux prevailing outside the magnetic shield, and besides causes inconvenience to device fabrication. Preferably, the ratio may range from 30 to 100. In this embodiment, $d2 = 1.4$ μm and $d1 = 50$ μm are set and the magnetic coupling between the ring and the coil can be obtained which is 50% for the device removed of magnetic shield.

Figure 6:
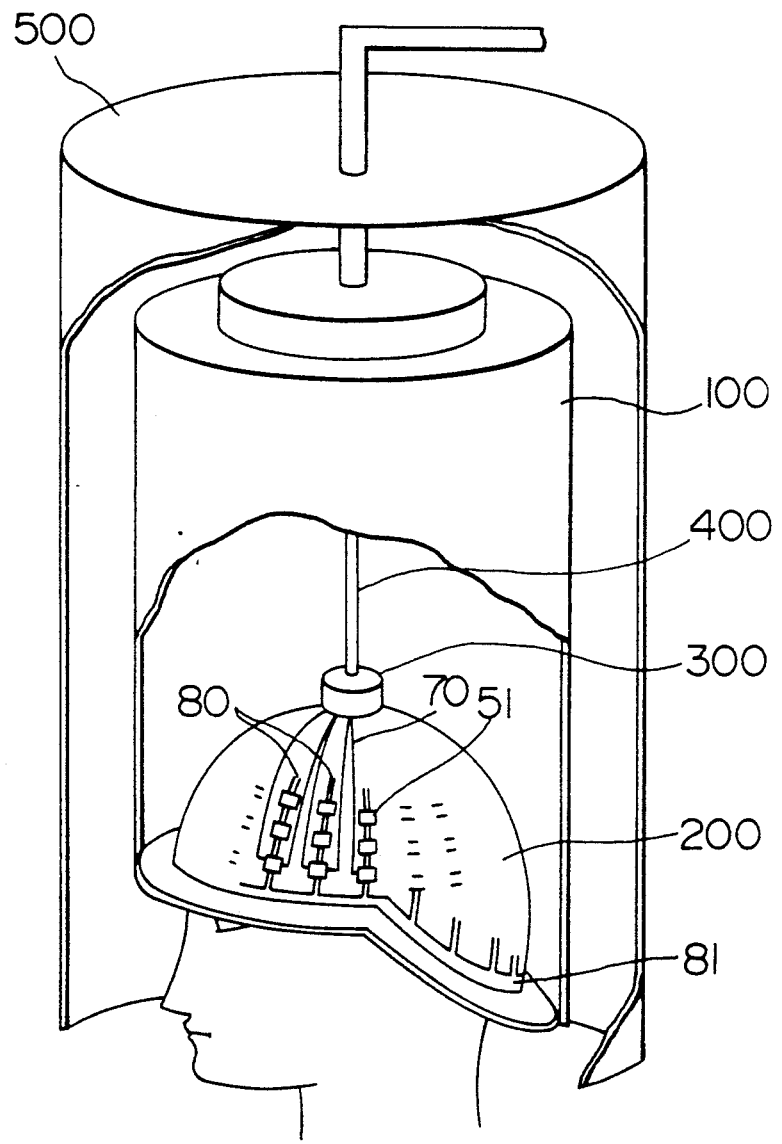
FIG. 6 is a partly exploded perspective view showing the overall construction of a multi-channel magnetoencephalograph according to an embodiment of the invention.
Figure 7:
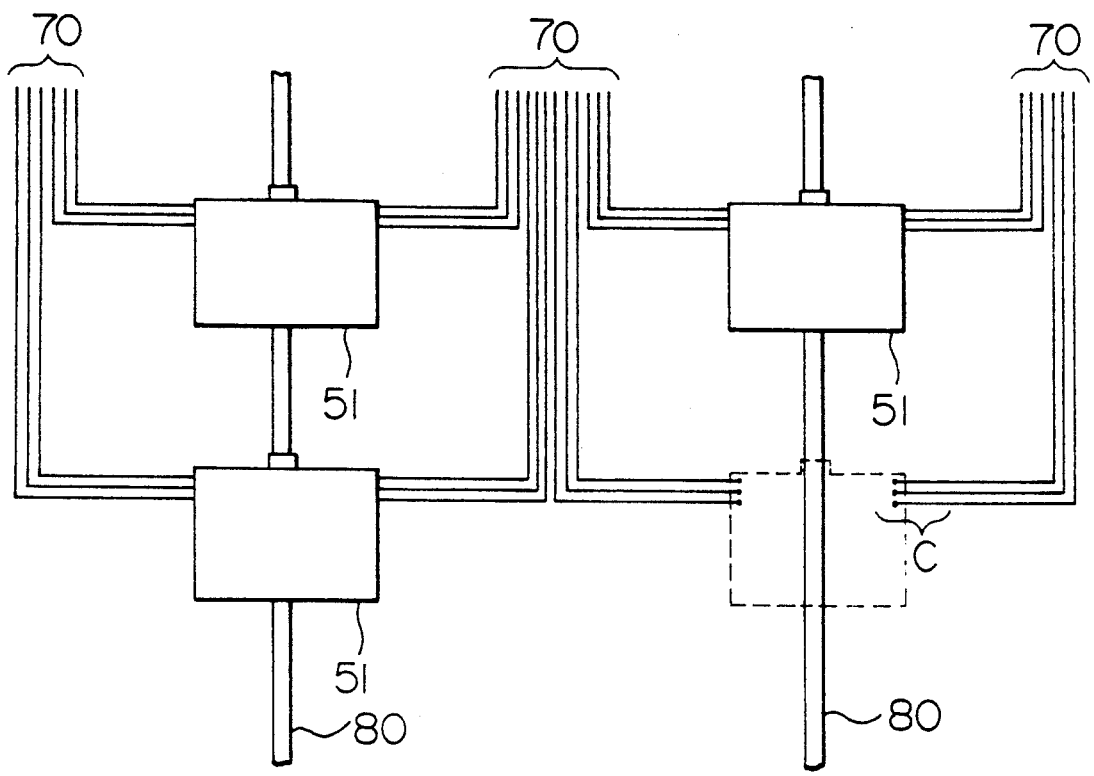
FIGS. 7 and 8 are fragmentary plan views showing portions of the FIG. 6 system.
Figure 8:
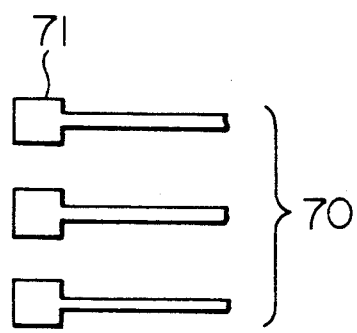

FIG. 6 illustrates, in partly exploded perspective view form, the overall construction of a multi-channel magnetoencephalograph using 200 SQUID magnetometers described previously. Liquid helium is poured into a liquid helium container 100 to maintain the internal temperature at 4.2K. The liquid helium container 100 is enclosed by a simple magnetic shield 500. The lower end opening of the liquid helium container 100 is closed by a substantially semi-spherical structure 200 which conforms to a human head standing for an object to be measured. Arranged on the inner wall surface of structure 200 facing that of the container are about 200 integrated-type SQUID magnetometers 51 described with reference to FIGS. 1 to 5. An electronic circuit for supplying bias current and feedback modulation signal to individual SQUID magnetometers and receiving output voltages from the SQUID rings and a sequencer for controlling the electronic circuit are collected in a controller 300. Conductors 70 for interconnecting each SQUID magnetometer and the controller are laid on the inner surface of the structure 200. The conductors 70 are connected to each SQUID magentometer 51 as detailed in FIG. 7. Each conductor 70 terminates in a pad 71 as shown in FIG. 8 exaggeratedly illustrating an exemplified portion C. When each SQUID magnetometer is mounted at a predetermined position on the structure 200, the pad 6 formed on the bottom surface of the SQUID magnetometer substrate as described with reference to FIG. 2 is connected to the pad 71. By making this connection portion detachable, one or ones of a great number of SQUID magnetometers which are defective in operation can be exchanged easily.

A bus 81 is laid on the inner surface of the structure 200 along the lower edge thereof and heat conductors 80 extend from the bus 81. The bus 81 and the heat conductors 80 are made of thermally conductive materials, for example, gold. When the SQUID magnetometer 51 is mounted on the inner surface of the structure 200, the heat conductor layer 40 provided for the projecting portions 5-1 of substrate of the SQUID magnetometer (see FIGS. 4 and 5) thermally makes contact to the heat conductor 80 on the structure 200. As liquid helium is poured into the container 100, the liquid helium begins to stagnate at the bottom of the container 100 and then acts to deprive heat generated in the superconducting thin film 30 through the heat conductor bus 81, heat conductor 80 and heat conductor layer 40. At that time, the magnetic shield 500 functions effectively to prevent flux trap from occurring in the superconducting thin film 30 per se. Consequently, the superconducting thin film 30 can act as magnetic shield at the most initial phase during pouring of liquid helium and the SQUID magnetometer 51 can be cooled without being affected by earth magnetism and ambient noise. After completion of cooling, the simple magnetic shield 500 may be removed.

Figure 9:
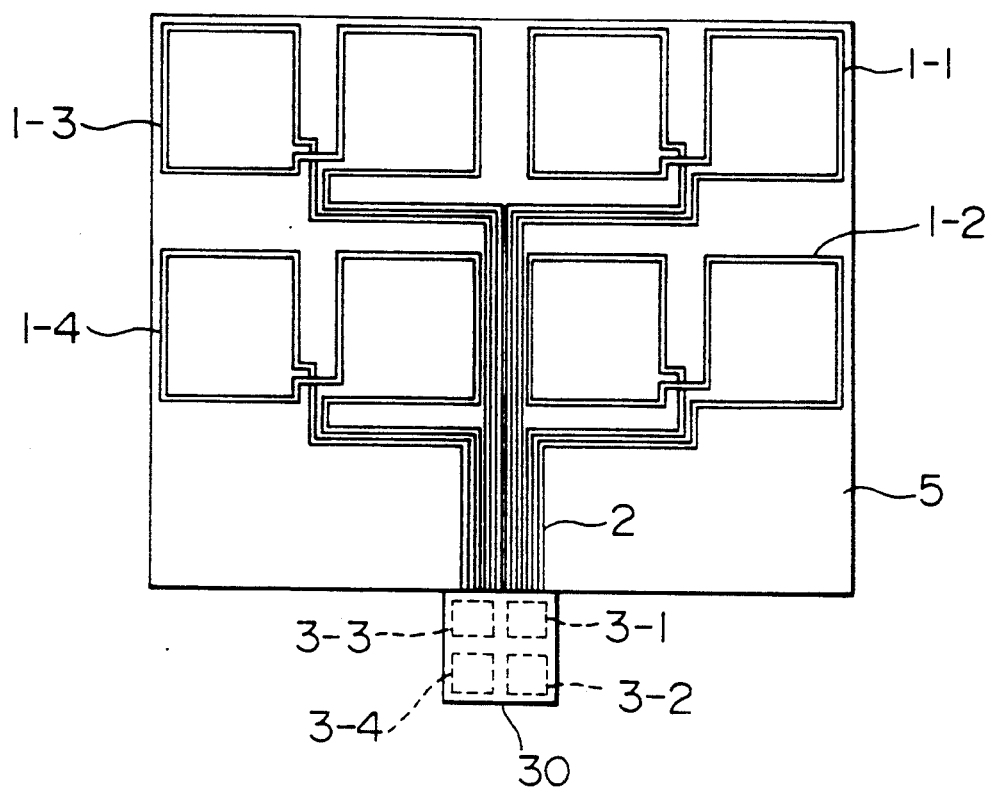
FIG. 9 is a plan view of a multi-channel SQUID magnetometer according to an embodiment of the invention.
Figure 10:
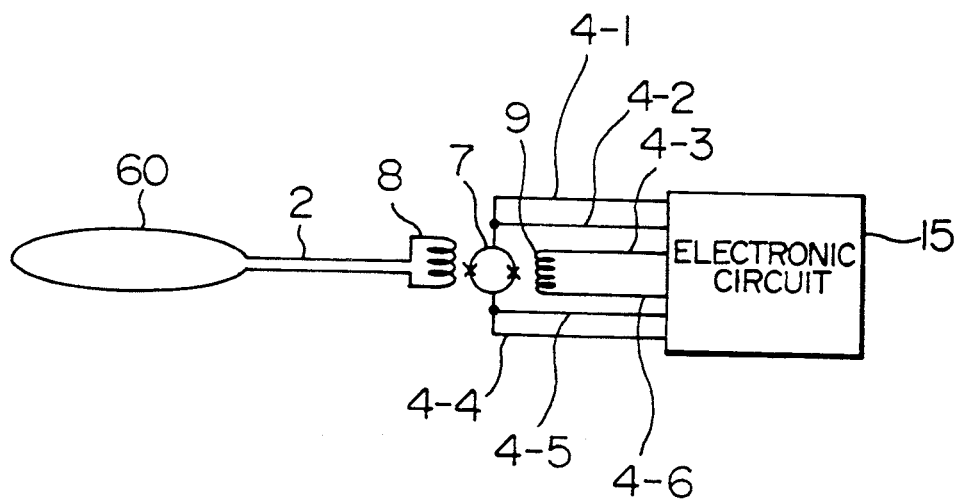
FIG. 10 is a diagram showing the concept of a prior art magnetometer.

In the foregoing embodiment, one-channel SQUID magnetometer is formed on a single substrate but a multi-channel SQUID magnetometer may alternatively be formed on a single substrate. FIG. 9 illustrates an embodiment of a multi-channel SQUID magnetometer, in particular, a four-channel SQUID magnetometer wherein four pickup coils 1-1, 1-2, 1-3 and 1-4 and four planar type SQUID's 3-1, 3-2, 3-3 and 3-4 are formed on a single substrate 5. The magnetic shield enclosing the SQUID is so formed as to meet conditions similar to those described in connection with FIGS. 1 to 5. Leads extending from each SQUID are not illustrated in FIG. 10 but they may be formed in a manner similar to that for FIG. 1. In an alternative, part of the magnetic shield 30 may be opened and connectors may be provided in the opening.

In the foregoing embodiments, the planar type linear differential coil is used as the pickup coil but other types of pickup coil, for example, a simple planar coil and a cubic type linear or quadratic differential coil may be used. For these types, the conditions for the size of the magnetic shield and the distance between the coil and the magnetic shield, described in connection with the foregoing embodiments, have to be satisfied.

We claim:

1. An integrated-type SQUID magnetometer comprising:
    a flat substrate made of a material through which magnetic flux can pass and having a large-area portion and a projecting portion jutting out of said large-area portion;
    a planar type SQUID formed on said projecting portion of said substrate and including a SQUID ring having at least one Josephson junction and an input coil coupled magnetically to said SQUID ring, said SQUID ring and said input coil being laminated on each other through a first spacing layer made of a material through which magnetic flux can pass;
    a pickup coil formed on said large-area portion of said substrate and connected to said input coil by a superconducting lead formed on said substrate;
    a second spacing layer covering said planar type SQUID and made of a material through which magnetic flux can pass; and
    a magnetic shield formed of a superconducting layer which is deposited to cover the second spacing layer and the lower surface of said projecting portion of said substrate to enclose said planar type SQUID.

2. An integrated-type SQUID magnetometer according to claim 1 wherein the area of said magnetic shield projected upon a plane coplanar to the surface of said substrate is $N^2$ times that of said planar type SQUID, where N has a value ranging from 1.1 to 5.

3. An integrated-type SQUID magnetometer according to claim 1 wherein said magnetic shield has a rectangular plan form and is so disposed as to be spaced from said pickup coil by a distance which is equal to or greater than a length of one side of said rectangular plan form.

4. An integrated-type SQUID magnetometer according to claim 1 wherein said magnetic shield has a rectangular plan form and is so disposed as to be spaced from said pickup coil by a distance which is 2 to 5 times a length of one side of said rectangular plan form.

5. An integrated-type SQUID magnetometer according to claim 1 wherein said second spacing layer has a thickness ranging from 10 μm to 1 cm.

6. An integrated-type SQUID magnetometer according to claim 1 wherein said second spacing layer has a thickness which is 10 to 10,000 times that of said first spacing layer.

7. An integrated-type SQUID magnetometer according to claim 1 wherein said second spacing layer has a thickness which is 30 to 100 times that of said first spacing layer.

8. An integrated-type SQUID magnetometer comprising:
   a flat substrate made of a material through which magnetic flux can pass;
   a planar type SQUID including a SQUID ring having at least one Josephson junction, an input coil coupled magnetically to said SQUID ring and a feedback modulation coil, said SQUID ring, input coil and feedback modulation coil being laminated on a first region of said substrate;
   a pickup coil formed on a second region of said substrate and connected to said input coil by a superconducting lead formed on said substrate; and
   a magnetic shield for enclosing said planar type SQUID.

9. An integrated-type SQUID magnetometer according to claim 8 wherein the area of said magnetic shield projected upon a plane coplanar to the surface of said substrate is $N^2$ times that of said planar type SQUID, where N has a value ranging from 1.1 to 5.

10. An integrated-type SQUID magnetometer according to claim 8 wherein said magnetic shield has a rectangular plan form and is so disposed as to be spaced from said pickup coil by a distance which is equal to or greater than a length of one side of said rectangular plan form.

11. An integrated-type SQUID magnetometer according to claim 8 wherein said magnetic shield includes a superconducting layer laminated on a spacing layer which covers said planar type SQUID and is made of a material through which magnetic flux can pass.

12. A multi-channel SQUID magnetometer comprising:
   a container charged with a cooling agent; and
   a plurality of SQUID magnetometers arranged on an inner wall surface of said container, each of said SQUID magnetometers comprising:
   a flat substrate made of a material through which magnetic flux can pass;
   a planar type SQUID including a SQUID ring having at least one Josephson junction, an input coil coupled magnetically to said SQUID ring and a feedback modulation coil, said SQUID ring, input coil and feedback modulation coil being laminated on a first region of said substrate;
   a pickup coil formed on a second region of said substrate and connected to said input coil by a superconducting lead formed on said substrate;
   a magnetic shield for enclosing said planar type SQUID; and
   a heat conductor member for thermally connecting the magnetic shield of each SQUID magnetometer to the inner bottom surface of said container.

13. A multi-channel SQUID magnetometer according to claim 12 wherein each SQUID magnetometer is detachably mounted on the inner wall surface of said container.

14. A multi-channel SQUID magnetometer comprising:
   a container charged with a cooling agent;
   a plurality of SQUID magnetometers arranged on an inner wall surface of said container, each of said SQUID magnetometers comprising:
   a flat substrate made of a material through which magnetic flux can pass;
   a planar type SQUID including a SQUID ring having at least one Josephson junction, an input coil coupled magnetically to said SQUID ring and a feedback modulation coil, said SQUID ring, input coil and feedback modulation coil being laminated on a first region of said substrate;
   a pickup coil formed on a second region of said substrate and connected to said input coil by a superconducting lead formed on said substrate; and
   a magnetic shield for enclosing said planar type SQUID;
   circuit means for receiving an output signal from each SQUID magnetometer and supplying a bias current and a feedback modulation signal to said SQUID ring and said feedback modulation coil of each SQUID magnetometer, respectively; and
   wiring means for electrically connecting said circuit means to said SQUID magnetometers.

15. A multi-channel SQUID magnetometer according to claim 14 wherein at least part of said wiring means is deposited on the inner wall surface of said container so that when said SQUID magnetometer is mounted on the inner wall surface of said container, electrical connection between said circuit means and said SQUID magnetometer may be completed.

16. An integrated-type SQUID magnetometer according to claim 1, wherein the magnetic shield covers both upper and side surfaces of the second spacing layer and side surfaces and said lower surface of the projecting portion of the substrate so as to substantially completely enclose said planar type SQUID.

17. An integrated-type SQUID magnetometer according to claim 8, wherein said magnetic shield substantially completely encloses said planar type SQUID.

18. A multi-channel SQUID magnetometer according to claim 12, wherein said magnetic shield substantially completely encloses said planar type SQUID.

19. A multi-channel SQUID magnetometer according to claim 14, wherein said magnetic shield substantially completely encloses said planar type SQUID.

* * * * *